United States Patent [19]
Delfyett et al.

[11] Patent Number: 5,546,415
[45] Date of Patent: Aug. 13, 1996

[54] HIGH SPEED PULSE SLICER/DEMULTIPLEXER WITH GAIN FOR USE IN SOLID STATE REGENERATIVE AMPLIFIER SYSTEMS

[75] Inventors: Peter J. Delfyett, Oviedo; A. Yusim; S. Gee, both of Orlando, all of Fla.

[73] Assignee: University of Central Florida, Orlando, Fla.

[21] Appl. No.: 369,737

[22] Filed: Jan. 6, 1995

[51] Int. Cl.$^6$ ........................................ H01S 3/10
[52] U.S. Cl. ................... 372/25; 372/18; 372/26
[58] Field of Search ..................... 372/18, 25, 41

[56] References Cited

U.S. PATENT DOCUMENTS

| | | | |
|---|---|---|---|
| 4,503,403 | 3/1985 | Taylor et al. | 331/37 |
| 4,528,668 | 7/1985 | Wayne et al. | 372/26 |
| 4,635,246 | 1/1987 | Taylor et al. | 370/3 |
| 4,907,234 | 3/1990 | Goldberg et al. | 372/18 |
| 4,907,238 | 3/1990 | Chun et al. | 372/32 |
| 4,928,316 | 5/1990 | Heritage et al. | 455/608 |
| 5,010,346 | 4/1991 | Hamilton et al. | 341/137 |
| 5,095,487 | 3/1992 | Meyerhofer et al. | 372/23 |
| 5,263,039 | 11/1993 | Skupsky et al. | 372/25 |
| 5,265,107 | 11/1993 | Delfyett, Jr. | 372/25 |
| 5,331,403 | 7/1994 | Rosker et al. | 356/350 |

*Primary Examiner*—Leon Scott, Jr.
*Attorney, Agent, or Firm*—Brian S. Steinberger

[57] ABSTRACT

A mode-locked solid state laser is disclosed for generating ultrashort optical pulses from a semiconductor type laser. A semiconductor pulse slicer/demultiplexer/modulator with gain amplification is used to modulate and amplify a generated optical beam whether or not the beam is pulsed, continuous wave, q-switched, or modelocked. Alternatively, the semiconductor pulse slicer/demultiplexer/modulator with gain amplification is used to gate a generated optical beam whether or not the beam is pulsed, continuous wave, q-switched, or modelocked. Alternatively, the semiconductor pulse slicer/demultiplexer/modulator with gain amplification is used to demultiplex a generated optical beam whether or not the beam is pulsed, continuous wave, q-switched, or modelocked. The invention uses only semiconductor type materials such as Titanium Saphire, Gallium Arsenide, Aluminum Gallium Arsenide (GaAs/AlGaAs) as both the pulse slicer/demultiplexer/modulator with gain amplification, and the mode-locked laser itself.

18 Claims, 3 Drawing Sheets

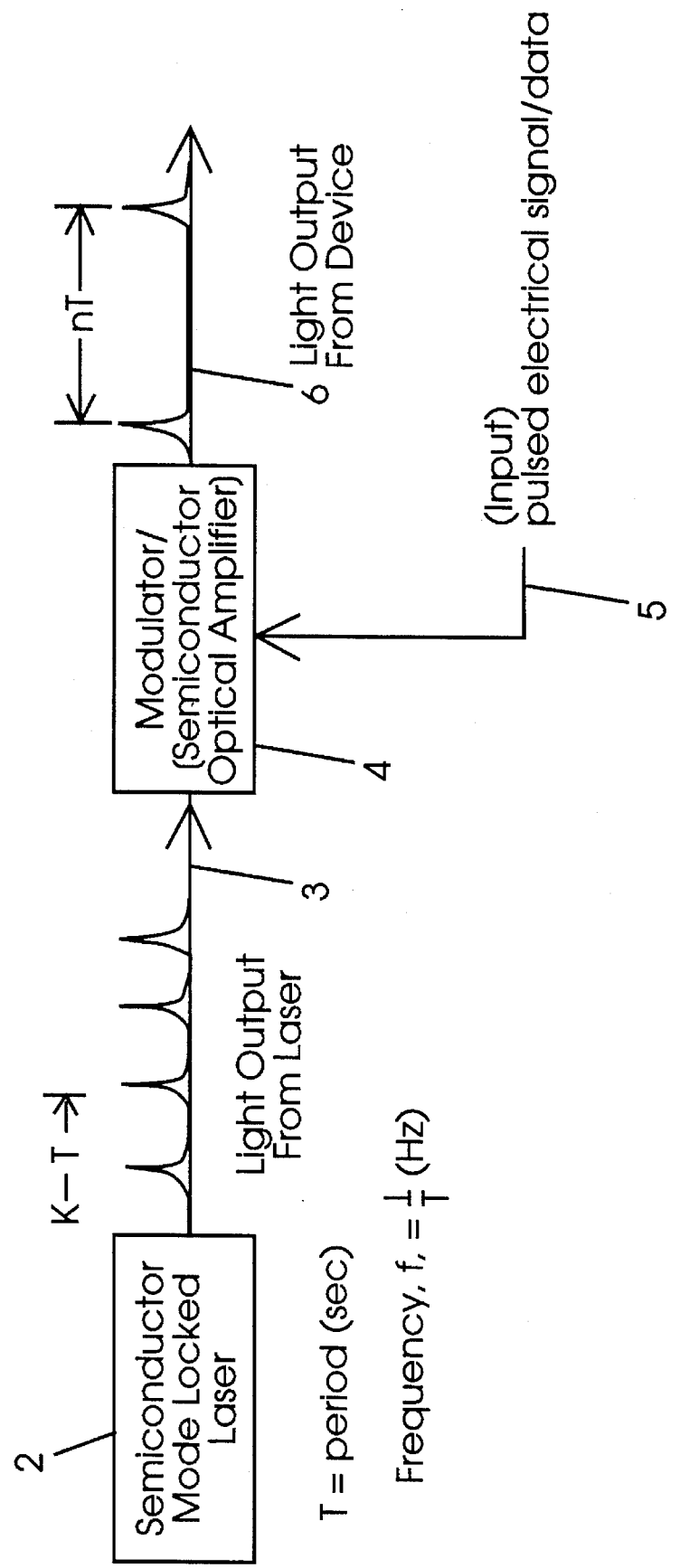

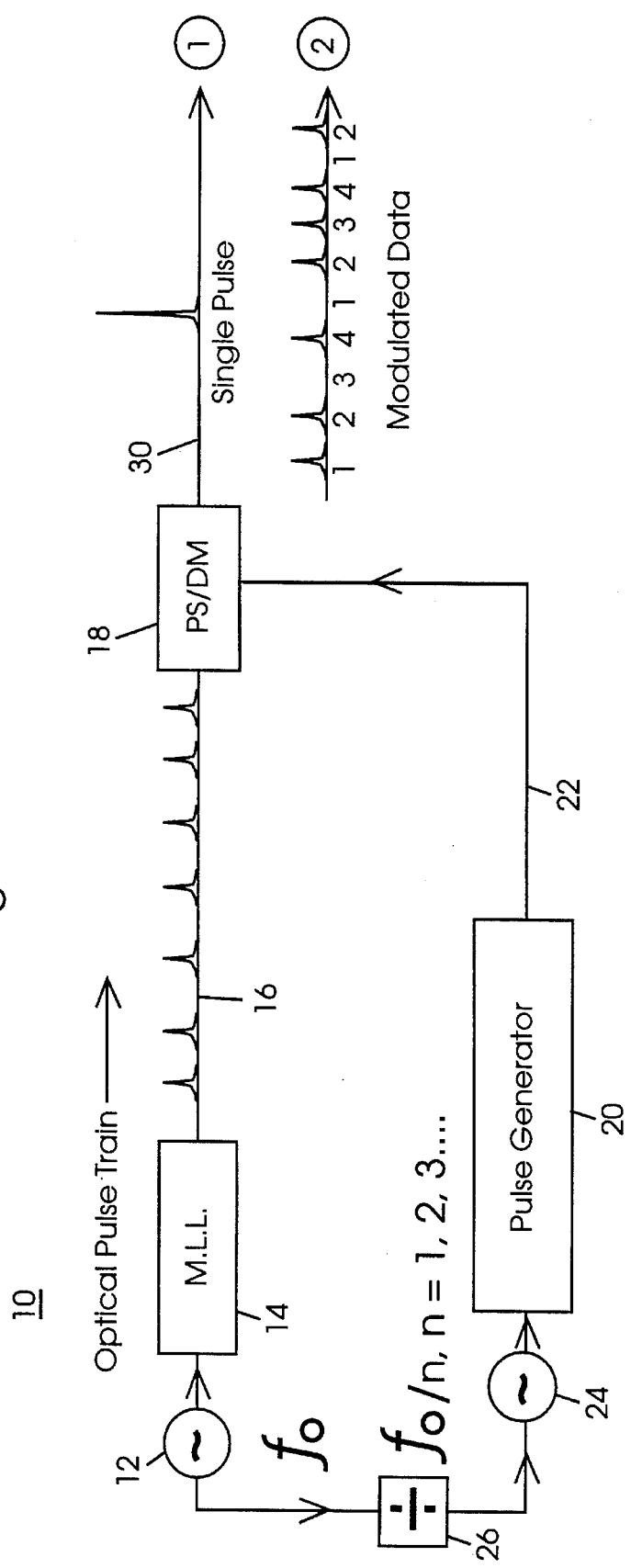

HIGH SPEED PULSE SLICER/DEMULTIPLEXER WITH GAIN FOR USE IN SOLID STATE REGENERATIVE AMPLIFIER SYSTEMS

This invention relates to lasers, and in particular to a pulse slicer and demultiplexer which shows for the combined use of semiconductor laser oscillators to be used in conjunction with high power solid stare regenerative amplifier systems.

BACKGROUND AND PRIOR ART

Solid stare lasers have been used to generate ultrashort optical pulses. However, them are problems inherent with these lasers. The techniques utilized to generate these pulses have generally relied on sophisticated electro-optic modulation techniques or passive techniques which use organic dyes to initiate the pulse generation process. These active and passive techniques add complexity and potential hazards to the operation because of the additional components added to the system and the chemical dangers of organic dyes.

Existing starting mechanisms for passive mode-locked lasers have cost approximately $5,000. These staring devices have required spaces of approximately one foot per side for the space needed. External power supplies such as RF power and mechanically actuated pumps have generally been needed for these mechanisms.

Mode-locked diode lasers have may applications of which the inventors of this invention, specifically Dr. Peter Delfyett have well documented. U.S. patent Ser. No. 08/241,620 entitled "Self Starting Femtosecond Ti Saphire Laser with Intracavity Multiquantum Well Absorber" filed on May 12, 1994, by inventor Peter J. Delfyett now U.S. Pat. No. 5,434,873, and U.S. patent Ser. No. 08/236,373 entitled "Mode Locked Laser Diode in a High Power Solid Siam Regenerative Amplifier and Mount Mechanism" filed on May 2, 1994, and assigned to the same assignees as this invention, both of which are incorporated by reference describe applicable laser applications Dr. Delfyett has other "mode-locked" laser inventions which includes U.S. Pat. No. 5,265,107, issued on Nov. 23, 1993.

Current compact modelocked ultrafast lasers suffer from the necessity of requiring a fixed cavity length. This necessity prevents the user from having the flexibility of choosing an optimum pulse repetition frequency for a specific application.

The pulse repetition frequency of compact diode lasers tend to be large, typically on the order of 100 megahertz to several gigahertz, owing to the fast gain recovery time of semiconductor diode lasers. Thus, applications which require an ultrashort pulse laser source operating at a lower pulse repetition rate are required to rely on large, expensive ultrafast laser systems.

Methods for reducing the pulse repetition rate of modelocked ultrafast laser systems typically rely on electro-optic materials for producing a "Pockel's Cell" which acts as a fast shutter or optical gate. This device is relatively large (approximately 1 cubic foot) and requires large electric fields (voltages in order to operate.

In addition, some optical pulse slicers have a limited clear aperature, which increases the insertion loss of the device.

For integrated optic applications, i.e. incorporating a laser device, such as a semiconductor laser, with a dielectric optical gate is costly and cumbersome owing to the material mismatch employed with current dielectric optical gates or modulators. Modulating of data signals has been accomplished in the prior art. U.S. Pat. No. 5,136,598 to Weller et al. describes where an optical beam from a laser is modulated. However, Weller requires multiple components to operate, where the optical beam is first modulated by a dielectric material and then subsequently amplified with a semiconductor source. The subject invention does not require, or need dielectric materials to operate.

Thus, this invention reduces the problems inherent with current mechanisms.

SUMMARY OF THE INVENTION

The first object of this invention is to provide an efficient starting mechanism for the generation of ultrashort optical pulse trains in mode-locked lasers.

The fourth object of this invention is to provide a low cost starting mechanism for the generation of ultrashort optical pulses trains in mode-locked lasers.

The second object of this invention is to provide a fixed repetition rate compact ultrafast modelocked laser with the flexibility of obtaining an adjustable pulse repetition frequency.

The third object of this invention is to provide for demodulation/demultiplexing in a mode-locked laser.

The fourth object of this invention is to for optical gain and amplification of the light output in a mode-locked laser.

The fifth object of this invention is to provide a method of generating a variable pulsed output from a continuously pulsed laser.

The sixth object of this invention is to provide a device to modulate the output of a pulsed laser source.

The seventh object of this invention is to reduce the repetition rate of a modelocked laser source.

The eighth object of this invention is provide gain to a modulated laser beam.

The ninth object of this invention is to simultaneously provide a modulation capability and optical amplification with a single device.

The tenth object of this invention is to reduce the repetition rate of high pulse repetition rate lasers.

The eleventh object of this invention is to provide an adjustable pulse repetition rate from a compact modelocked laser source to allow the laser to be used for a low repetition rate application.

The twelfth object of this invention is to adjust the repetition rate of a modelocked laser so that the laser can be used with a high power laser amplifier system, e.g. a regenerative amplifier or single/multipass amplifier.

This invention further avoids the problems of the prior art, because the novel pulse slicer:

(1) Can operate at high pulse repetition frequencies which allow ultrafast laser applications to utilize compact and efficient semiconductor laser sources.

(2) The operating voltages of the subject invention is typically about 5 volts.

(3) The invention provides optical gain or amplification, thus eliminating insertion losses.

(4) The invention is made of semiconductor material which facilitates integrating both the laser and pulse slicer/modulator on a single device structure.

The invention can be used with the new starting mechanism for the generation of ultrashort optical pulse trains in mode-locked lasers discussed in U.S. patent Ser. No. 08/241,620 entitled "Self Starting Femtosecond Ti Saphire Laser with Intracavity Multiquantum Well Absorber" filed on May 12, 1994, by inventor Peter J. Delfyett; and can be used with the invention disclosed in U.S. patent Ser. No. 08/236,373 entitled "Mode Locked Laser Diode in a High Power Solid State Regenerative Amplifier and Mount Mechanism" filed on May 2, 1994, and assigned to the same assignees as this invention, both of which are incorporated by reference. This invention helps to reduce the cost of previous methods of starting mechanisms for passive mode-locked lasers by 90% from approximately $5,000 to $500. The starting mechanism of the invention can be as small as 0.1 inch on a side as compared to 1 foot on a side for prior mechanisms. The invention requires no external power supplies to operate. The generated optical pulses can be used in a wide variety of applications such as diagnostic testing, communications, computers, medicine and automotive applications.

This invention can be used as a new pulse slicer/demodulator/demultiplexer or optical gate for changing the pulse repetition frequency of pulsed laser sources to optimize the pulse repetition rate for specific applications. This invention reduces the cost of previous methods for changing the pulse repetition rate of pulsed laser systems from approximately $5,000 to approximately $1,000. The gating device is typically a few hundred microns per side or less, demonstrating it small size, in comparison to present methodologies which use devices of one foot per side. This invention requires low voltages(approximately 5 volts) and a few tenths of an ampere of current.

Further objects and advantages of this invention will be apparent from the following detailed description of a presently preferred embodiment which is illustrated schematically in the accompanying drawings.

BRIEF DESCRIPTION OF THE FIGURES

FIG. 1 illustrates a schematic for the preferred location of the invention in a mode-locked diode laser.

FIG. 2 shows a preferred embodiment of using the invention used as demultiplexer in a mode-locked diode laser.

DESCRIPTION OF THE PREFERRED EMBODIMENT

Figure 4:
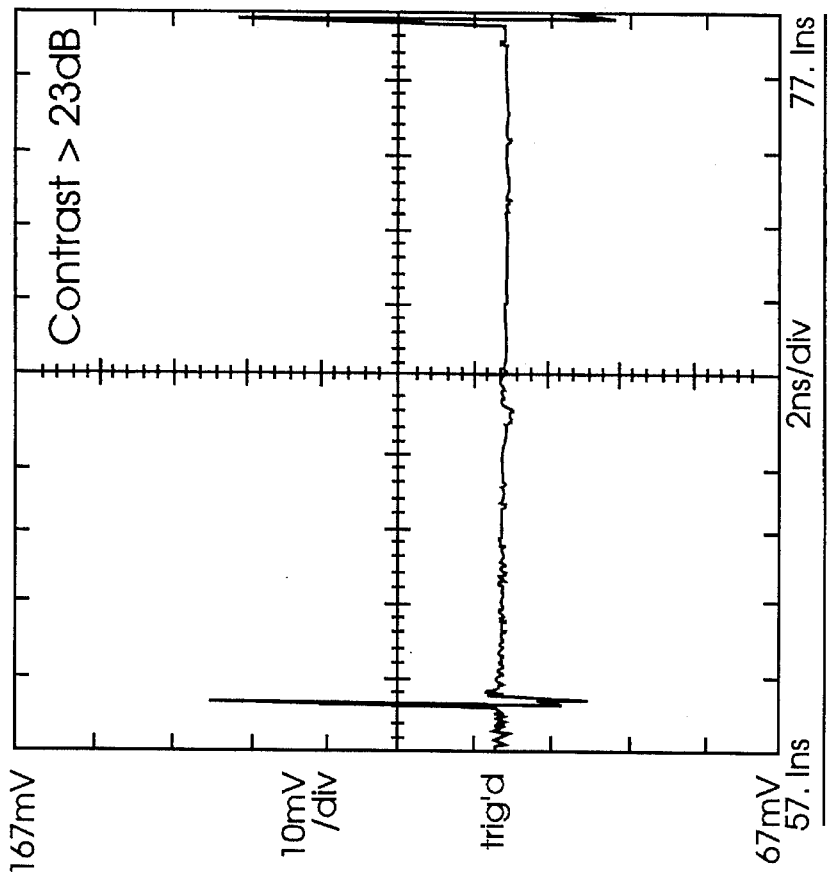
FIG. 4 illustrates an oscilloscope trace displaying the output of the pulse slicer device plotted versus time, which shows a reduced pulse repetition frequency of 55 MHz.

Before explaining the disclosed embodiment of the present invention in detail it is to be understood that the invention is not limited in its application to the details of the particular arrangement shown since the invention is capable of other embodiments. Also, the terminology used herein is for the purpose of description and not of limitation.

FIG. 1 illustrates a schematic for the preferred location of the invention in a mode-locked diode laser. The components of FIG. 1 along with their respective functions will now be described. Component 2 is a compact, modelocked laser source, such as a modelocked semiconductor laser or other compact laser source, e.g. fiber laser, micro chip laser, vertical cavity semiconductor laser, and the like. This device provides an input optical signal to the semiconductor pulse slicer. 3 illustrates the output of the said laser source. In this illustration, the output of the said laser source is pulsed. However, the output may also be a steady continuous beam. The output from said laser source is directed towards and injected into the semiconductor pulse slicer. 4 designates the new device described in this patent. It is comprised of semiconductor material and is controlled by an electrical signal. The end result of this device is to gate or slice a portion of the output of the said laser source, resulting in a modulated, or modified optical output. In addition to gating or slicing a portion of the output of said laser, the device also amplifies the sliced or gated portion of the optical signal, providing both a slicing/gating/modulating function with an amplification function. Component 5 designates the controlling signal applied to the semiconductor gating device. This control pulse is electrical in the present embodiment. However, the controlling signal may also be optical in nature, such as but not limited to an optical control beam or optical control pulse. 6 designates the output of the semiconductor gating device. The output can be one of several types. One, the output 6 can be a modulated signal suitable for carrying information in a communication environment. Two, output 6 can be a selected optical pulse that is subsequently injected into and amplified in an alternate optical amplifier. Three, output 6, can be an optical signal or pulse train that can be generated for applications that require an optimized optical pulse repetition frequency.

FIG. 2 shows a preferred embodiment of using the invention used as demultiplexer in a mode-locked diode laser. Each of the components of FIG. 2 along with their respective function will now be described. 10 refers to a specific embodiment of using the semiconductor pulse slicer/gate/modulator/demultiplexer with a laser system, whose general purpose is to create and generate an optical signal. Component 14 is a laser source, which can alternatively be pulsed, gain switched, q-switched, modelocked or continuous wave. The purpose of source 14 is to generate an optical beam/signal 10. Numeral 16 refers to the optical signal, which can be a continuous beam, pulsed, gain switched, q-switched or modelocked according the respective source 14 that is used. The purpose of signal 16 is to supply an optical signal 10 to the semiconductor pulse/slicer/optical gate/modulator 18. Element 12 refers to an electrical signal generator whose characteristic is to generate an electrical signal of a varying nature, such as but not limited to an electrical pulse, or an electrical sinusoidal current. Generator 12 can be alternatively embodied as an electrical signal generator, a pulse generator or a frequency synthesizer whose purpose is to provide an electric timing signal to the laser 14 and to the electrical signal processor 26. Component 18 refers to the semiconductor pulse slicer/demultiplexer/modulator with gain whose purpose is to modulate an optical beam whether the beam is pulsed, continuous wave, q-switched, modelocked and the like. Alternatively, 18 can gate an optical beam whether the beam is pulsed, continuous wave, q-switched, modelocked and the like. Alternatively, 18 can be used to demultiplex an optical beam whether or not the beam is pulsed, continuous wave, q-switched, modelocked and the like. Component 20 can be an electrical signal generator that is used to generate an electrical signal of varying nature such as but not limited to an electrical pulse, an electrical sinusoidal current and the like. Generator 20 can alternatively be embodied as a pulse generator or frequency synthesizer whose purpose is to provide an electric timing signal to component 18. Element 22 refers to an electric timing signal that is generated by generator 20. Signal 22 can be pulsed, sinusoidal, or carrying information in a data format depending on the type of generator 20 that is utilized. Signal 22 is applied to and is used to control component 18 in order to either modulate, gate or slice optical beam 16. Component 24 is an electrical trigger or synchronizing signal, which can be pulsed or sinusoidal. The purpose of signal 24 is to provide a timing or synchronizing signal to the pulse generator 20. This timing signal controls the pulse generator 20 and allows the pulse generator to provide an electric timing signal 22 semiconductor gate 18. Component 26 is an electrical signal processor, such as an electrical frequency divider, whose purpose is to operate and process an electric timing signal from the signal generator 12. The output of processor 26 is the electric trigger or the synchronizing signal 24 described previously. Element 30 is the output from component 18 which is an optical beam which was modified from initial optical signal 16.

Figure 3:
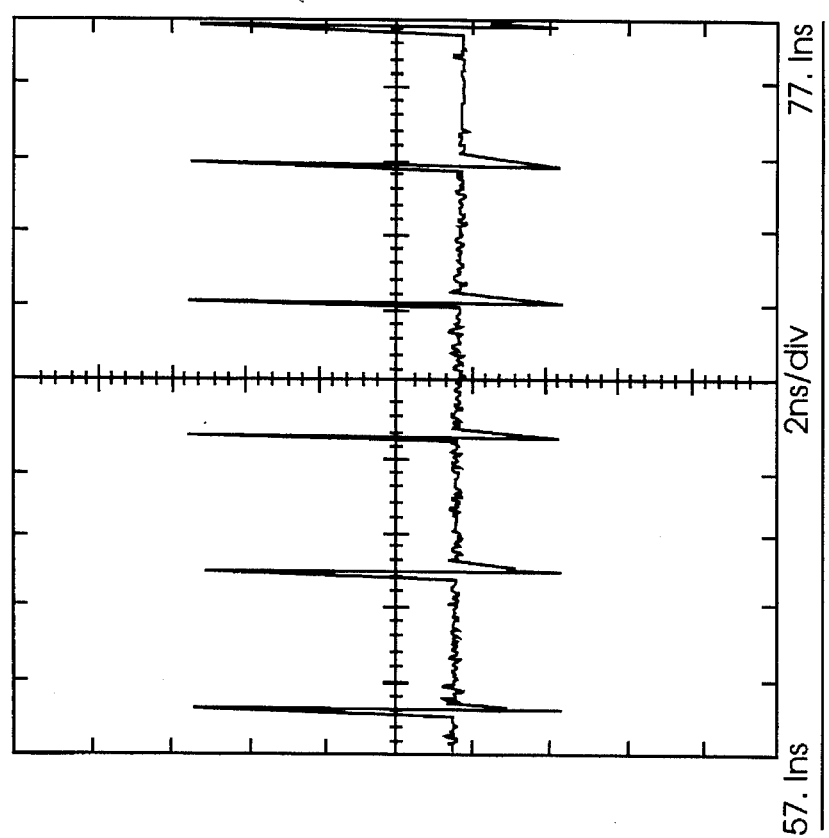
FIG. 3 illustrates an oscilloscope trace displaying the input pulse train generated from the modelocked diode laser plotted versus time, which shows the pulse repetition rate of the laser to be 274 MHz.

FIG. 3 illustrates an oscilloscope trace of the output of a semiconductor modelocked laser 14 of FIG. 2 which is plotted versus time. FIG. 3 establishes an initial optical beam 16 of FIG. 2 which has been generated by laser 14.

FIG. 4 illustrates an oscilloscope trace of the output 30 of FIG. 2 from the semiconductor gate/slicer 18 of FIG. 2 which demonstrates a modified optical beam, whether gated, modulated, demultiplexed, pulse sliced and the like.

The invention components are compact, efficient and low maintenance. The invention can be produced from bandgap engineerable gain media, where the semiconductor laser source and semiconductor gate/slicer can be made of materials that can be designed to operate desired frequencies. The invention can be completely electrically pumped where all power can be supplied by electrical energy. No optical power is required to transfer energy to or to do work on any device in the application. In the subject invention, the power is not supplied by optical beams. The components in the invention are potentially integrable, on chip or with optical fiber media. Potentially integrable means that the laser and gate/demultiplexer/slicer can be constructed in one single device instead of two separate devices as noted in the preferred embodiment. Here, the laser and the gate/demultiplexer/slicer can be made in a single optical fiber or in a single semiconductor device.

Although, the preferred embodiment can use Titanium Sapphire as the solid state media, other types of solid state materials can be used such as but not limited to Cr:YAG, Cr:Fosterite, Nd:YAG, Nd:glass, color center lasers, semiconductor diode lasers, and optically active fiber lasers.

Although the preferred embodiment utilizes Gallium Arsenide, Aluminum Gallium Arsenide GaAs/AlGaAs) semiconductor materials for the pulse slicer/demultiplexer/gate, other solid state and semiconductor materials may be used such as but not limited to InP, InGaAlAs, InGaP, GaN, ZnSe, CdSe, or any group III–V or II–VII or IV semiconductor compound material, or other solid state material such as but not limited to Ti:Saphire, Cr:YAG, Nd:YAG, CrFostefite, Nd:YAG, Nd:glass, color center lasers, semiconductor diode lasers, optically active fiber lasers, or other active solid state materials such as Er:Si or Er:Indium-Tin-Oxide.

The invention disclosed herein can have wide array of applications. In communications, the invention can be used as a transmitter of optical data in fiber optic networks. In computers, the invention can be used as a transmitter of optical data, as high speed processors of optical data and as high speed switches of optical data, and the like. In medical applications, the invention can be used for imaging through body tissue. In high speed diagnostic applications, the invention can be used to measure optical-matter phenomena in condensed matter materials, to measure very fast events, processes, mechanisms, interactions and the like. Further, the invention can have applicability for initiating or as seed pulses in solid state generative amplifier systems.

Furthermore, this invention can be used to modulate a continuous or pulsed optical beam to transmit information. This invention can further be used to open or close the optical pathway in an optical fiber to either allow light to be transmitted or prevent the light from reaching its destination. Furthermore, this invention can be used to operate as a nonlinear optical element for gating or switching in an optical communication network.

Additional applications can be for generating ultrashort electrical signals, high speed photography, atmospheric, environmental and remote sensing and the recording of information for optical data storage systems.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

I claim:

1. A method for generating an adjustable pulse repetition frequency from a fixed repetition rate compact ultrafast mode-locked laser to provide ultrashort pulses comprising the steps of:

generating a continuous optical pulse train from a mode-locked diode laser source;

providing a variable bias signal to the mode-locked diode laser and to a single semiconductor; and modulating and amplifying the optical pulse train from the single semiconductor to provide a single optical pulse output signal, wherein varying the rate of the biasing signal varies the repetition rate of the generated optical pulse train.

2. The method of generating of claim 1, wherein the step of generating a continuous optical pulse train includes:

generating pulses from a semiconductor diode laser.

3. The method of generating of claim 1, wherein the step of generating a continuous optical pulse train includes:

generating pulses from Titanium Sapphire.

4. The method of generating of claim 1, wherein the step of generating a continuous optical pulse train includes:

generating pulses from GaAs and AlGaAs.

5. The method of generating of claim 1, wherein the step of generating a continuous optical pulse train includes:

generating pulses from Cr:Fosterite.

6. The method of generating of claim 1, wherein the step of generating a continuous optical pulse train includes:

generating pulses from Cr:YAG.

7. The method of generating of claim 1, wherein the step of generating a continuous optical pulse train includes:

generating pulses from Nd:YAG.

8. The method of generating of claim 1, wherein the step of generating a continuous optical pulse train includes:

generating pulses from Nd:Glass.

9. The method of generating of claim 1, wherein the step of generating a continuous optical pulse train includes:

generating pulses from a color center laser.

10. The method of generating of claim 1, wherein the step of generating a continuous optical pulse train includes:

generating pulses from an optically active fiber laser.

11. The method of generating of claim 1, wherein the modulating step includes:

modulating the continuous pulse train from a pulse generator.

12. The method of generating of claim 1, where the modulating step further includes:

amplifying the continuous pulse train.

13. The method of generating of claim 1, where the modulating step further includes: semiconductor materials chosen from at least one of:

Gallium Arsenide and Aluminum Gallium Arsenide.

14. A system for generating an adjustable pulse repetition frequency from a fixed repetition rate compact ultrafast mode-locked laser comprising:

a mode-locked semiconductor laser for generating a continuous fixed repetition rate optical pulse train;

a variable electric bias generator for providing an electrical timing signal to both a first output and to a second output, the first output connected to the mode-locked semiconductor laser;

a frequency divider for processing the second output signal from the frequency generator and to provide a synchronizing signal output:

a pulse generator for receiving the synchronizing signal and for generating selected pulses as electrical timing signals; and a semiconductor means for receiving both the continuous fixed rate optical pulse train and the selected pulses, the semiconductor means both modulating and amplifying the pulse train by the selected pulses to produce a single optical pulse output signal, and wherein varying the rate of the variable electric bias generator will vary the repetition rate of the generated optical pulse train.

15. The system for generating of claim 14, wherein the mode-locked semiconductor laser includes:

Titanium Sapphire.

16. The system for generating of claim 14, wherein the mode-locked semiconductor laser includes at least one of:

GaAs and AlGaAs.

17. The system for generating of claim 14, wherein the semiconductor means includes:

Titanium Sapphire.

18. The system for generating of claim 14, wherein the semiconductor means includes at least one of:

GaAs and AlGaAs.

* * * * *